(12) United States Patent
Varjos et al.

(10) Patent No.: US 10,932,364 B2
(45) Date of Patent: Feb. 23, 2021

(54) TRANSPARENT CONDUCTIVE FILM

(71) Applicant: CANATU OY, Vantaa (FI)

(72) Inventors: Ilkka Varjos, Espoo (FI); Bjørn Mikladal, Helsinki (FI); Teemu Alvari, Helsinki (FI); Liam O'Suillebhain, Helsinki (FI)

(73) Assignee: Canatu Oy, Helsinki (FI)

( * ) Notice: Subject to any disclaimer, the term of this patent is extended or adjusted under 35 U.S.C. 154(b) by 0 days.

(21) Appl. No.: 16/615,146

(22) PCT Filed: Jun. 13, 2018

(86) PCT No.: PCT/FI2018/050448
§ 371 (c)(1),
(2) Date: Nov. 20, 2019

(87) PCT Pub. No.: WO2018/234627
PCT Pub. Date: Dec. 27, 2018

(65) Prior Publication Data
US 2020/0174622 A1 Jun. 4, 2020

(30) Foreign Application Priority Data

Jun. 22, 2017 (FI) ...................... 20175595

(51) Int. Cl.
| H05K 1/09 | (2006.01) |
| G06F 3/044 | (2006.01) |
| G06F 3/045 | (2006.01) |
| H05K 1/02 | (2006.01) |
| H05K 3/46 | (2006.01) |

(52) U.S. Cl.
CPC .............. *H05K 1/09* (2013.01); *G06F 3/045* (2013.01); *G06F 3/0445* (2019.05);
(Continued)

(58) Field of Classification Search
CPC ...... G06F 3/0445; G06F 3/0446; G06F 3/045; G06F 2203/04103; H05K 1/0289;
(Continued)

(56) References Cited

U.S. PATENT DOCUMENTS

2009/0213090 A1* 8/2009 Mamba ................. G06F 3/044
345/174
2011/0285641 A1* 11/2011 Huang .................. G06F 3/0412
345/173
(Continued)

FOREIGN PATENT DOCUMENTS

| WO | WO 2007057501 | 5/2007 |
| WO | WO 2014184440 | 11/2014 |

OTHER PUBLICATIONS

Written Opinion of the International Searching Authority and International Search Report for PCT/FI2018/050488.
(Continued)

*Primary Examiner* — Kenneth B Lee, Jr.
(74) *Attorney, Agent, or Firm* — Joseph M. Butscher; The Small Patent Law Group, LLC

(57) ABSTRACT

The application relates to a transparent conductive film (1) according to one embodiment, wherein the first transparent layer (31) having a first pattern of first electrodes is provided, e.g. deposited, on the first side (2a) of a transparent base film (2) and the second transparent layer (32) having a second pattern of second electrodes is provided, e.g. deposited, on the second side (2b) of the transparent base film (2). Further, the application relates to a method for producing a transparent conductive film. Further, the application relates to a touch sensing device and to different uses.

21 Claims, 6 Drawing Sheets

(52) U.S. Cl.
CPC ......... *G06F 3/0446* (2019.05); *H05K 1/0289* (2013.01); *H05K 3/4644* (2013.01); *G06F 2203/04103* (2013.01); *H05K 2201/0108* (2013.01); *H05K 2201/026* (2013.01); *H05K 2201/0323* (2013.01)

(58) Field of Classification Search
CPC ............. H05K 1/09; H05K 2201/0108; H05K 2201/026; H05K 2201/0323
See application file for complete search history.

(56) References Cited

U.S. PATENT DOCUMENTS

| | | |
|---|---|---|
| 2012/0062469 A1 | 3/2012 | Guard |
| 2012/0153970 A1 | 6/2012 | Mignard |
| 2013/0162547 A1* | 6/2013 | Yoo ......................... G06F 3/041 345/173 |
| 2013/0168138 A1* | 7/2013 | Yamazaki ................ B05D 5/12 174/253 |
| 2013/0222325 A1 | 8/2013 | Cok |
| 2014/0001018 A1* | 1/2014 | Lee ......................... G06F 3/041 200/275 |
| 2017/0108964 A1 | 4/2017 | Sato |

OTHER PUBLICATIONS

Search Report for Finnish Patent Application No. 20175595.
"Multifunctional Free-Standing Single-Walled Carbon Nanotube Films," Nasibulin, et al., ACSNANO, vol. 5, No. 5, pp. 3214-3221(2011).

* cited by examiner

TRANSPARENT CONDUCTIVE FILM

This application is a National Phase of International Application No. PCT/FI2018/050448, filed Jun. 13, 2018, which relates to and claims priority benefits from FI Application No. 20175595, filed Jun. 22, 2017, both of which are hereby incorporated by reference in their entireties.

TECHNICAL FIELD

The present application relates to a transparent conductive film. The present application further relates to a method for producing a transparent conductive film. The present application further relates to a touch sensing device, and to different uses.

BACKGROUND

User interfaces for different kinds of electrical apparatuses are nowadays often realized by means of different types of touch sensing devices based on touch sensitive films instead of conventional mechanical buttons. Different kinds of touch pads and touch screens of e.g. mobile phones, portable computers and similar devices are well known examples of these. Touch sensing devices based on touch sensitive films also provide a freedom to the designers trying to find functionally more versatile, smaller, cheaper, lighter, and also visually more attractive devices.

A key element in such touch sensing devices is a touch sensitive film comprising one or more conductive layers configured to serve as one or more sensing electrodes. The general operating principle of this kind of film is that the touch of a user by e.g. a fingertip or some particular pointer device changes the electrical properties of an electrical measuring circuitry to which the touch sensitive film is connected. The actual measuring principle can be e.g. resistive or capacitive.

In touch screens, in addition to the touch sensing capability, the touch sensitive film should be optically transparent to enable use of the film on top of a display of an electronic device, i.e. to enable the display of the device to be seen through the touch sensitive film. Moreover, transparency is also important from the touch sensitive film visibility point of view. Visibility of the touch sensitive film to the user of e.g. an LCD (Liquid Crystal Display), an OLED (Organic Light Emitting Diode) display, or an e-paper (electronic paper) display seriously deteriorates the user experience. So far, transparent conductive oxides like ITO (Indium Tin Oxide) have formed the most common group of the conductive layer materials in touch sensitive films. However, from the visibility point of view, they are far from an ideal solution. The high refractive index of e.g. ITO makes the patterned sensing electrodes visible.

One promising new approach in touch sensitive films is found in layers formed of or comprising networked nanostructures. In addition to a suitable conductivity performance, a layer consisting of networks of e.g. carbon nanotubes (CNT), or carbon nanobuds having fullerene or fullerene-like molecules covalently bonded to the side of a tubular carbon molecule (NANOBUD® is a registered trade mark of Canatu Oy), can possess flexibility, mechanical strength and stability superior in comparison with e.g. ITO.

However, even with the use of networked nanostructures, the electrodes forming visible patterns may be an issue. The inventors have therefore recognized the need for a transparent conductive film having increased transparency.

Purpose

The purpose is to provide a new type of a transparent conductive film. Further, the purpose is to provide a method for producing a transparent conductive film. Further, the purpose is to provide a touch sensing device. Further, the purpose is to provide new uses.

SUMMARY

The transparent conductive film is characterized by what is presented in claim 1.

The method is characterized by what is presented in claim 14.

The touch sensing device is characterized by what is presented in claim 17.

The uses are characterized by what is presented in claim 18 or claim 19.

BRIEF DESCRIPTION OF THE DRAWINGS

The accompanying drawings, which are included to provide a further understanding of the method, the transparent conductive film, and the touch sensitive device, and constitute a part of this specification, illustrate embodiments and together with the description help to explain the principles of the above. In the drawings:

FIG. 4b illustrates schematically a front view of the transparent conductive film as illustrated in FIG. 4a;

FIG. 7b illustrates schematically a sectional view of the transparent conductive film as illustrated in FIG. 7a.

DETAILED DESCRIPTION

Figure 1:
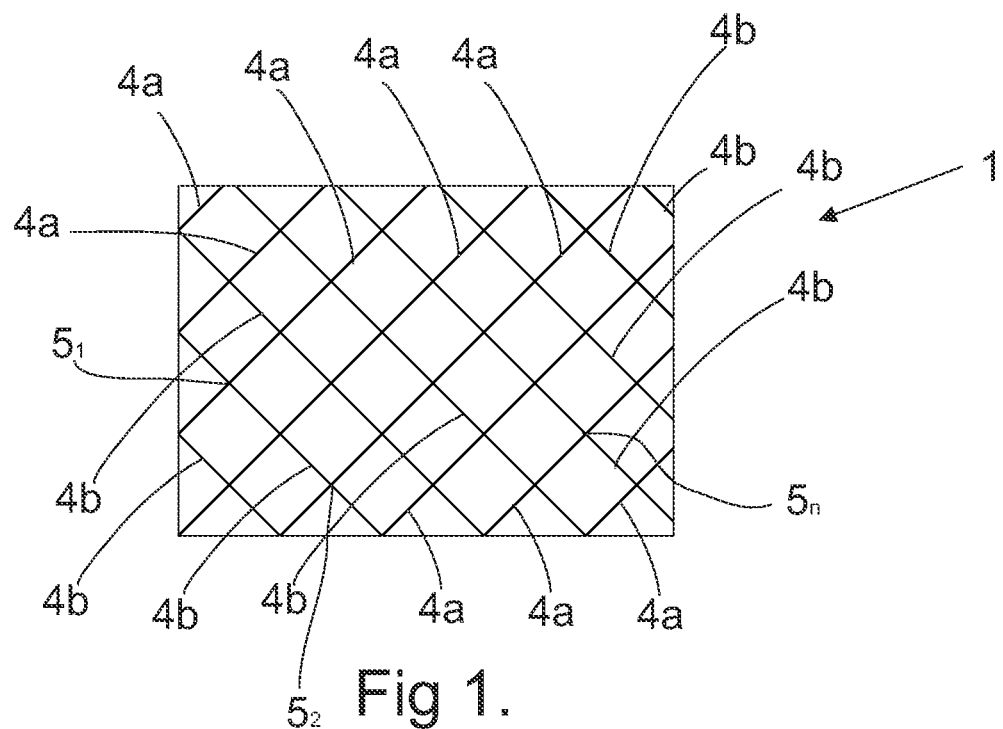
FIG. 1 illustrates schematically a front view of a transparent conductive film according to one embodiment.

The present application relates to a transparent conductive film having an observation region, wherein the transparent conductive film comprises:

at least one transparent base film having a first side and a second side, which is opposite to the first side;

provided on the at least one transparent base film, in the observation region a first transparent layer comprising transparent conductor material being patterned to have a first pattern of first electrodes and optionally at least one first passive gap area separated from the first pattern of first electrodes, and a second transparent layer comprising transparent conductor material being patterned to have a second pattern of second electrodes and optionally at least one second passive gap area separated from the second pattern of second electrodes;

wherein the first transparent layer and the second transparent layer are arranged one on the other in a vertical direction such that the transparent conductor material of the first transparent layer and the transparent conductor material of the second transparent layer form at least one intersection area where transparent conductor material of the first transparent layer and transparent conductor material of the second transparent layer appear to at least partly overlap when viewed from an essentially perpendicular direction to the first side or the second side of the at least one transparent base film, and at least one non-overlapping area where transparent conductor material of the first transparent layer and transparent conductor material of the second transparent layer do not appear to overlap; and wherein the total percentage of visible light transmitted through the transparent conductor material of the first transparent layer and of the second transparent layer is substantially the same over the observation region.

The present application relates to a transparent conductive film having an observation region, wherein the transparent conductive film comprises:

at least one transparent base film having a first side and a second side, which is opposite to the first side;

provided on the at least one transparent base film, in the observation region a first transparent layer comprising transparent conductor material being patterned to have a first pattern of first electrodes and optionally at least one first passive gap area separated from the first pattern of first electrodes, and a second transparent layer comprising transparent conductor material being patterned to have a second pattern of second electrodes and optionally at least one second passive gap area separated from the second pattern of second electrodes;

wherein the first transparent layer and the second transparent layer are arranged one on the other in a vertical direction such that the transparent conductor material of the first transparent layer and the transparent conductor material of the second transparent layer form at least one intersection area where transparent conductor material of the first transparent layer and transparent conductor material of the second transparent layer appear to at least partly overlap when viewed from an essentially perpendicular direction to the first side or the second side of the at least one transparent base film, and at least one non-overlapping area where transparent conductor material of the first transparent layer and transparent conductor material of the second transparent layer do not appear to overlap; and wherein the coverage of the transparent conductor material, at the at least one intersection area, of at least one of the first transparent layer and the second transparent layer is reduced to be lower than the coverage of the transparent conductor material of the first transparent layer or the second transparent layer at the at least one non-overlapping area where transparent conductor material of the first transparent layer and transparent conductor material of the second transparent layer do not appear to overlap, such that the total percentage of visible light transmitted through the transparent conductor material of the first transparent layer and of the second transparent layer is substantially the same over the observation region.

In one embodiment, the total percentage of visible light transmitted through the transparent conductor material of the first transparent layer and of the second transparent layer is kept substantially the same over the whole transparent conductive film.

The present application further relates to a method for producing a transparent conductive film having an observation region, wherein the method comprises:

providing at least one transparent base film having a first side and a second side, which is opposite to the first side;

providing on the at least one transparent base film, in the observation region a first transparent layer comprising transparent conductor material being patterned to have a first pattern of first electrodes and optionally at least one first passive gap area separated from the first pattern of first electrodes, and a second transparent layer comprising transparent conductor material being patterned to have a second pattern of second electrodes and optionally at least one second passive gap area separated from the second pattern of second electrodes;

wherein the first transparent layer and the second transparent layer are arranged one on the other in a vertical direction such that the transparent conductor material of the first transparent layer and the transparent conductor material of the second transparent layer form at least one intersection area where transparent conductor material of the first transparent layer and transparent conductor material of the second transparent layer appear to at least partly overlap when viewed from an essentially perpendicular direction to the first side or the second side of the at least one transparent base film, and at least one non-overlapping area where transparent conductor material of the first transparent layer and transparent conductor material of the second transparent layer do not appear to overlap;

wherein the coverage of the transparent conductor material, at the at least one intersection area, of at least one of the first transparent layer and the second transparent layer is adjusted such that the total percentage of visible light transmitted through the transparent conductor material of the first transparent layer and of the second transparent layer is substantially the same over the observation region.

The present application further relates to a method for producing a transparent conductive film having an observation region, wherein the method comprises:

providing at least one transparent base film having a first side and a second side, which is opposite to the first side;

providing on the at least one transparent base film, in the observation region a first transparent layer comprising transparent conductor material being patterned to have a first pattern of first electrodes and optionally at least one first passive gap area separated from the first pattern of first electrodes, and a second transparent layer comprising transparent conductor material being patterned to have a second pattern of second electrodes and optionally at least one second passive gap area separated from the second pattern of second electrodes;

wherein the first transparent layer and the second transparent layer are arranged one on the other in a vertical direction such that the transparent conductor material of the first transparent layer and the transparent conductor material of the second transparent layer form at least one intersection area where transparent conductor material of the first transparent layer and transparent conductor material of the second transparent layer appear to at least partly overlap when viewed from an essentially perpendicular direction to the first side or the second side of the at least one transparent base film, and at least one non-overlapping area where transparent conductor material of the first transparent layer and transparent conductor material of the second transparent layer do not appear to overlap;

wherein the coverage of the transparent conductor material, at the at least one intersection area, of at least one of the first transparent layer and the second transparent layer is reduced such that the total percentage of visible light transmitted through the transparent conductor material of the first transparent layer and of the second transparent layer is substantially the same over the observation region.

In one embodiment, the method is carried out to increase the transparency of the transparent conductive film.

In one embodiment, the coverage of the transparent conductor material, at the at least one intersection area, of at least one of the first transparent layer and the second transparent layer is reduced such that the total percentage of visible light transmitted through the transparent conductor material of the first transparent layer and of the second transparent layer is substantially the same over the observation region.

In one embodiment, the coverage of the transparent conductor material, at the at least one intersection area, of at least one of the first transparent layer and the second transparent layer is reduced compared to the coverage of the transparent conductor material of said transparent layer at the at least one non-overlapping area. I.e. the coverage of the transparent conductor material of the transparent layer may be reduced, at the at least one intersection area, compared to the coverage of the transparent conductor material of the same transparent layer at the at least one non-overlapping area.

The present application further relates to a touch sensing device comprising a transparent conductive film as defined in the present application or a touch sensitive film as defined in the present application.

The present application further relates to the use of the transparent conductive film as defined in the present application in a photovoltaic system, in a heating application, in a current conductor, in a display system, in a display electrode, in a lighting system, in a light switch, or in a light control film.

The present application further relates to the use of the touch sensing device as defined in the present application in a photovoltaic system, in a heating application, in a current conductor, in a display system, in a display electrode, in a lighting system, in a light switch, or in a light control film.

The expression "an observation region" should be understood in this specification, unless otherwise stated, as referring to a predetermined area or region, observed or defined in the lateral direction of the transparent conductive film. In one embodiment, the observation region covers at least 50%, or at least 60%, or at least 70%, or at least 80%, or at least 90% of the area of the transparent conductive film.

The expression that the total percentage of visible light transmitted is "substantially the same" should be understood in this specification, unless otherwise stated, as meaning that the total percentage of visible light transmitted may be not exactly the same throughout the observation region but that some variation in the total percentage of visible light transmitted may occur over the observation region. In one embodiment, the total percentage of visible light transmitted through the transparent conductor material of the first transparent layer and of the second transparent layer varies at most 5 percentage units, or at most 3 percentage units, or 0.05-5 percentage units, or 0.05-3 percentage units, or 0.05-1 percentage units, peak-to-peak over the observation region. Preferably, there may be only minor deviation between the percentages of visible light transmitted through the transparent conductor material at the intersection area compared to the non-overlapping area. However, there may be small slits within the pattern of electrodes and/or the at least one passive gap area of the first transparent layer and/or of the second transparent layer, where the total percentage of visible light transmitted may deviate more than the above variation range. However, these slits are so dimensioned that at a usual observation distance of the application of the transparent conductive film at issue, the deviation of transmittance is not visible for a human eye. Such observation distance may be different in different applications. In one embodiment, the observation distance is 10-100 cm, or 20-100 cm, or 30-100 cm or 50-100 cm, or 60-300 cm. In other words, these slits may have a dimension below the average human eye resolution. In one embodiment, the width of such a slit is 2-1000 µm, or 2-500 µm, or 2-50 µm, or 50-500 µm. In one embodiment, the transparent conductor material of the first transparent layer and/or of the second transparent layer comprises one or more slits having a width of 2-1000 µm, or 2-500 µm, or 2-50 µm, or 50-500 µm.

In applications like a touch sensor, a display electrode, or a light switch for small appliances of less than 15" diagonal such as a wearable device, a mobile phone, a tablet, a laptop, an automotive information display, or a dashboards, the observation distance may be e.g. 20-100 cm. In applications like a touch sensor, a display electrode, or a light switch for large area monitors or televisions, the observation distance may be e.g. 60-300 cm. In applications like a touch sensor, a display electrode, a light switch, a current conductor, or a heater element on e.g. a window or a windshield, the observation distance may be e.g. 30-100 cm.

The expression "intersection area" should be understood in this specification, unless otherwise stated, as meaning the area where transparent conductor material of the first transparent layer and transparent conductor material of the second transparent layer appear to at least partly overlap when viewed from an essentially perpendicular direction to the first side or the second side of the at least one transparent base film. I.e. when the first transparent layer and the second transparent layer are arranged one on the other in a vertical direction the transparent conductor material of the first transparent layer and the transparent conductor material of the second transparent layer may form at least one intersection area.

The expression "non-overlapping area" should be understood in this specification, unless otherwise stated, as meaning the area where transparent conductor material of the first transparent layer and transparent conductor material of the second transparent layer do not appear to overlap when viewed from an essentially perpendicular direction to the first side or the second side of the at least one transparent base film. I.e. at the non-overlapping area, when viewed from an essentially perpendicular direction to the first side or the second side of the at least one transparent base film, transparent conductor material may be present in the first transparent layer or in the second transparent layer but not in both.

The expression that the transparent layer comprising transparent conductor material is provided "on" the transparent base film should be understood in this specification, unless otherwise stated, as meaning that the transparent layer is provided or formed to lie on or upon the transparent base film or is being at least partly embedded therein. The transparent base film may serve as a carrier or support structure for the transparent layer comprising transparent conductor material. In one embodiment, the transparent base film serves as a carrier or support structure for the first transparent layer and/or for the second transparent layer.

The term "comprising" is used in this specification to mean including the feature(s) or act(s) followed thereafter, without excluding the presence of one or more additional features or acts. It will further be understood that reference to "an" item refers to one or more of those items.

The expression "film" should be understood in this specification, unless otherwise stated, as referring to a structure having its lateral dimensions substantially larger than its thickness. In that sense, a film may be considered as being a "thin" structure.

In one embodiment, the two sides of the transparent base film formed by the lateral dimensions thereof form the first side and the second side.

In one embodiment, the thickness of the transparent conductive film is 0.1 µm-5 mm, or 20-500 µm.

The expression "electrode" should be understood in this specification, unless otherwise stated, as referring to an electrical conductor being able to supply and/or transport voltage and/or current.

The expression "transparent" should be understood in this specification, unless otherwise stated, as referring to optical transparency of the conductive film and the parts and materials thereof in the relevant wavelength range at issue. In other words, "transparent" material or structure refers to a material or structure allowing light, or generally electromagnetic radiation, at such relevant wavelength to propagate through such material or structure. The relevant wavelength range may depend on the application where the transparent conductive film is to be used. In one embodiment, the relevant wavelength range is the visible wavelength range of about 390 to about 700 nm.

Further, the transparency of the conductive film and the parts thereof primarily refers to the transparency in the thickness direction of the conductive film so that in order to be "transparent", sufficient portion of light energy incident on the conductive film or a part thereof shall propagate through it in the thickness direction. Such sufficient portion may depend on the application in which the conductive film is to be used. In one embodiment, such portion is 20-99.99% of the energy of light incident perpendicularly on the transparent conductive film, at a location where the transparent conductor material is present. In one embodiment, said transmittance is 20% or higher, or 30% or higher, or 40% or higher, or 50% or higher, or 60% or higher, or 70% or higher, or 80% or higher, 90% or higher. The transmittance may be measured according to standard JIS-K7361, ASTM D1003. The portion of visible light that is propagated or transmitted through the transparent conductive film or parts thereof may depend on the ability of the transparent conductive film, or e.g. the type of transparent conductor material used therein, to change transmission of visible light. A change in light transmittance may be a result of e.g. loss caused absorption, scattering, and/or reflection, or some other change in light transmittance such as change in color or clarity.

In one embodiment, the coverage of the transparent conductor material, at the at least one intersection area, of at least one of the first transparent layer and the second transparent layer is adjusted such that the total percentage of visible light transmitted through the transparent conductor material of the first transparent layer and of the second transparent layer is substantially the same over the observation region.

In one embodiment, the coverage of the transparent conductor material of the first transparent layer and/or the second transparent layer is adjusted by reducing a predetermined amount of transparent conductor material at the at least one intersection area.

In one embodiment, the coverage of the transparent conductor material, at the at least one intersection area, of at least one of the first transparent layer and the second transparent layer is reduced to be lower than the coverage of the transparent conductor material of the first transparent layer or the second transparent layer at the at least one non-overlapping area where transparent conductor material of the first transparent layer and transparent conductor material of the second transparent layer do not appear to overlap.

In one embodiment, the total thickness of the transparent conductor material of the first transparent layer and of the second transparent layer is substantially uniform over the observation region.

The inventors found out that the visual appearance to the user of the transparent conductive film may be improved when reducing the coverage of the transparent conductor material, at the intersection areas, of at least one of the first transparent layer and the second transparent layer. While reducing the coverage of the transparent conductor material, at the intersection areas, of at least one of the first transparent layer and the second transparent layer, one is able to provide a transparent conductive film having a substantially uniform visual appearance. While reducing the coverage of transparent conductor material at the parts where the transparent conductor material of the first transparent layer and of the second transparent layer appear to at least partly overlap, the transmission of visible light through the transparent conductive film may be increased.

In one embodiment, the first transparent layer and the second transparent layer are arranged one on the other in a vertical direction such that the first electrodes and the second electrodes form at least one intersection area where the first electrodes and the second electrodes appear to overlap when viewed from the essentially perpendicular direction to the first side or the second side of the at least one transparent base film.

In one embodiment, the coverage of the transparent conductor material, at one or more of the intersection areas, of at least one of the first electrode and the second electrode forming that intersection area is reduced to be lower than the coverage of the transparent conductor material of said electrode outside the intersection area.

In one embodiment, the at least one intersection area comprises at least one intersection point, where the first electrodes and the second electrodes appear to cross each other when viewed from an essentially perpendicular direction to the first side or the second side of the at least one transparent base film. In one embodiment, the at least one intersection area comprises at least one intersection point where the first electrodes and the second electrodes appear to cross each other when viewed from an essentially perpendicular direction to the first side or the second side of the at least one transparent base film, and wherein the coverage of the transparent conductor material, at the at least one intersection point, of at least one of the first electrode and the second electrode forming that intersection point is reduced to be lower than the coverage of the transparent conductor material of said electrode outside the intersection point.

In one embodiment, the first transparent layer comprises transparent conductor material being patterned to have at least one first passive gap area. In one embodiment, the second transparent layer comprises transparent conductor material being patterned to have a second passive gap area.

In one embodiment, the first transparent layer and the second transparent layer are arranged one on the other in a vertical direction such that the transparent conductor material of the first transparent layer and the transparent conductor material of the second transparent layer form at least one of the following:
  at least one intersection area where the first electrodes and the second electrodes appear to at least partly overlap;
  at least one intersection area where the first electrodes and a second passive gap area appear to at least partly overlap;
  at least one intersection area where a first passive gap area and a second passive gap area appear to at least partly overlap;
  at least one intersection area where the second electrodes and a first passive gap area appear to at least partly overlap.

Often, when producing a transparent conductive film, e.g. the first pattern of first electrodes and the second pattern of second electrodes of the transparent layers form a predetermined number of intersection points, which may be visually seen by the bare eye when using a transparent conductor material, such as carbon nanotubes or carbon nanobuds or other conductor material that absorbs or refracts light to a certain extent. Further, the first pattern of first electrodes and the second pattern of second electrodes of the transparent layers may also form a predetermined number of intersection areas, when the first transparent layer and the second transparent layer are arranged one on the other in a vertical direction, e.g. during a process for bonding them together with the transparent base film(s). Due to process variation in the bonding or lamination process, the first pattern of first electrodes and the second pattern of second electrodes may appear to slightly overlap also in other parts of the electrode pattern than just at the intersection points where the first pattern of first electrodes and the second pattern of second electrodes appear to cross each other. The inventors surprisingly found out that when using the method as described in the current application, a transparent conductive film can be produced having the visual appearance of being made of only one layer of transparent conductor material. The transparent conductive film has the added utility that essentially no patterning formed by e.g. the electrodes or other parts may be substantially visually seen by the bare eye of the viewer. The inventors further found out that any additional filler material, usually needed to compensate the visual defect caused by the fact that the electrodes of the different layers appear to cross each other at the intersection points, can be left out from the transparent conductive film produced with the method as described in this application.

In one embodiment, the transparent conductive film lacks any additional filler material to compensate the visual defect caused by the fact that the transparent conductor material of the different layers appear to overlap at the intersection areas. In one embodiment, the transparent conductive film lacks any additional filler material to compensate the visual defect caused by the fact that the electrodes of the different layers appear to cross each other at the intersection points.

In one embodiment, the coverage of the transparent conductor material is reduced at one or more of the intersection areas. In one embodiment, the coverage of the transparent conductor material is reduced at all of the intersections areas.

A "passive gap area" refers to an area of the transparent layer which is not to be electrically connected. The passive gap are not electrically connected to any contact arrangement for connecting the transparent layer to an external electrical power supply. Such passive gap area thus is, in electrical point of view, a "passive" structure in the sense that is does not participate in the electrical operation of the transparent conductive film.

The passive gap area may be separated from the pattern of electrodes. There may be just small slots having a width, for example, of some tens of micrometers present between the pattern of electrodes and the passive gap areas.

In one embodiment, the first transparent layer comprises transparent conductor material patterned to have at least one first passive gap area but the second transparent layer does not have a second passive gap area, or vice versa.

In one embodiment, the first transparent layer comprises transparent conductor material patterned to have at least one first passive gap area and the second transparent layer comprises transparent conductor material patterned to have at least one second passive gap area, wherein within the observation region, the at least one first passive gap area and the at least one second passive gap area do not appear to overlap.

In one embodiment, the first transparent layer comprises transparent conductor material patterned to have at least one first passive gap area, and the second transparent layer comprises transparent conductor material patterned to have at least one second passive gap area, wherein the at least one first passive gap area and the at least one second passive gap area appear to at least partly overlap, at at least one intersection area, when viewed from an essentially perpendicular direction to the first side or the second side of the at least one transparent base film.

In one embodiment, the coverage of the transparent conductor material of the first passive gap area and/or of the second passive gap area is adjusted by reducing a predetermined amount of transparent conductor material at the at least one intersection area.

In one embodiment, the first passive gap area has a first edge and a second edge, which is opposite to the first edge, and the second passive gap area has a first edge and a second edge, which is opposite to the first edge, and wherein the coverage of the transparent conductor material is gradually or continuously reduced from the first edge to the second edge of the first gap area while the coverage of the transparent conductor material is gradually or continuously reduced in an inverse manner from the second edge to the first edge of the second gap area, or vice versa.

In one embodiment, percentage of visible light transmitted through transparent conductor material of a first passive gap area is changed between or from about 100% to about X % from the first edge to the second edge, while the percentage of visible light transmitted through transparent conductor material of a second passive gap area is changed between or from about X % to about 100% from the first edge to the second edge, or vice versa, wherein X is the percentage of visible light transmitted through the transparent conductor material of the first transparent layer or of the second transparent layer outside an intersection area.

In one embodiment, at the at least one intersection area, the coverage of the transparent conductor material is gradually or continuously reduced from the first transparent layer while the coverage of the transparent conductor material is gradually or continuously reduced in an inverse manner from the second transparent layer, or vice versa.

In one embodiment, the coverage of the transparent conductor material of one transparent layer is reduced at the intersection area such that the percentage of visible light transmitted at the intersection area through the transparent conductor material of said transparent layer is between or from about 100 to about X %, wherein X % is the percentage of visible light transmitted through the transparent conductor material of said transparent layer outside the intersection area. In one embodiment, the coverage of the transparent conductor material of one transparent layer is reduced at the intersection area such that the percentage of visible light transmitted at the intersection area through the transparent conductor material of said transparent layer is gradually increased from the percentage of visible light transmitted through the transparent conductor material of said transparent layer outside the intersection area to about 100%.

By gradually reducing the coverage of the transparent conductor material at the intersection areas that may be formed as a result of process variation during e.g. a lamination process, whereby the first pattern of first electrodes and the second pattern of second electrodes may appear to slightly overlap also in other parts of the electrode patterns than at the intersection points, has the added utility of reducing the possibility of one being able to recognize such overlapping by the bare eye.

In one embodiment, the coverage of the transparent conductor material of one transparent layer, at the intersection area, is reduced such that the percentage of visible light transmitted through the transparent conductor material of said transparent layer at the intersection area is 0.1-50 percentage units, or 0.1-20 percentage units, or 1-20 percentage units, higher than the percentage of visible light transmitted through the transparent conductor material of said transparent layer outside the intersection area. In one embodiment, the coverage of the transparent conductor material of one transparent layer, at the intersection point, is reduced such that the percentage of visible light transmitted through the transparent conductor material of said transparent layer at the intersection point is 0.1-50 percentage units, or 0.1-20 percentage units, or 1-20 percentage units, higher than the percentage of visible light transmitted through the transparent conductor material of said transparent layer outside the intersection point.

In one embodiment, at least one of the at least one transparent base film of the conductive film is made of dielectric material, or all of the transparent base films of the conductive film are made of dielectric material. In one embodiment, the transparent base film is formed of transparent glass or plastic material. The material used to form the transparent base film should be suitable for serving as a substrate for the transparent layer comprising transparent conductor material.

In one embodiment, the material of the transparent base film is selected from a group consisting of sodalime glass, aluminosilicate glass, borosilicate glass, and any combination thereof. In one embodiment, the material of the transparent base film is selected from a group consisting of polyethylene terephthalate (PET), polycarbonate (PC), polymethyl methacrylate (PMMA), cyclic olefin copolymer (COP), triacetate (TAC), cyclic Olefin Copolymer (COC), poly(vinyl chloride) (PVC), poly(ethylene 2,6-naphthalate (PEN), polyimide (PI), polypropylene (PP), polyethylene (PE), and any combination thereof. The material of the transparent base film is not, however, limited to these examples.

In one embodiment, the transparent base film has a thickness of 1-2000 µm, or 10-1000 µm, or 30 to 500 µm, or 50-300 µm. However, the transparent base film may also be thicker in some applications.

In one embodiment, the first pattern of first electrodes is a similar pattern as the second pattern of second electrodes. In one embodiment, the first pattern of first electrodes is a different pattern than the second pattern of second electrodes. In one embodiment, the first pattern of first electrodes are X electrodes and the second pattern of second electrodes are Y electrodes, or vice versa.

The first pattern of first electrodes and the second pattern of second electrodes may form, when the first transparent layer and the second transparent layer are arranged the one on the other in a vertical direction, any pattern suitable for the specific application. In one embodiment, the first pattern of first electrodes and the second pattern of second electrodes may form, when the first transparent layer and the second transparent layer are arranged one on the other in a vertical direction, a diamond pattern, a snowflake pattern, or a pattern in the form of a grid. In one embodiment, the first pattern of first electrodes and the second pattern of second electrodes may form, when the first transparent layer and the second transparent layer are arranged one on the other in a vertical direction, a diamond pattern.

In one embodiment, the transparent conductive film comprises at least one transparent base film. In one embodiment, the transparent conductive film comprises one transparent base film. In one embodiment, the transparent conductive film comprises a first transparent base film and/or a second transparent base film. In one embodiment, the transparent conductive film comprises a first transparent base film. In one embodiment, the transparent conductive film comprises a first transparent base film and a second transparent base film. In one embodiment, the transparent conductive film comprises multiple transparent base films.

In one embodiment, the at least one transparent base film comprises or consists of one transparent base film. In one embodiment, the at least one transparent base film comprises or consists of a first transparent base film and/or a second transparent base film. In one embodiment, the at least one transparent base film comprises or consists of a first transparent base film. In one embodiment, the at least one transparent base film comprises or consists of a first transparent base film and a second transparent base film. In one embodiment, the at least one transparent base film comprises or consists of multiple transparent base films.

In one embodiment, the first transparent layer is provided on the first side of a transparent base film and the second transparent layer is provided on the second side of the transparent base film.

In one embodiment, the first transparent layer is provided on a first transparent base film and the second transparent layer is provided on a second transparent base film, wherein the first transparent layer and the second transparent layer are arranged one on the other in a vertical direction such that the first transparent base film or the second transparent base film is situated between the first transparent layer and the second transparent layer. In one embodiment, the first transparent layer is provided on a first transparent base film and the second transparent layer is provided on a second transparent base film, wherein the first transparent layer and the second transparent layer are arranged one on the other in a vertical direction such that the first transparent base film or the second transparent base film, but not both the first transparent base film and the second transparent base film, is situated between the first transparent layer and the second transparent layer.

In one embodiment, the first transparent layer is provided on the first side of a transparent base film and the second transparent layer is provided on the same first side of the transparent base film such that the first transparent layer and the second transparent layer are arranged one on the other in a vertical direction such that the first electrodes and the second electrodes appear to overlap at at least one intersection area while the first pattern of first electrodes and the second pattern of second electrodes are not otherwise essentially overlapping. In one embodiment, the first transparent layer is provided on the first side of a transparent base film and the second transparent layer is provided on the same first side of the transparent base film such that the first transparent layer and the second transparent layer are arranged one on the other in a vertical direction such that the first electrodes and the second electrodes appear to cross each other at a predetermined number of intersection points while the first pattern of first electrodes and the second pattern of second electrodes are not otherwise essentially overlapping. In this context, the term "not otherwise essentially overlapping" should be understood in this specification, unless otherwise stated, such that the intension is to keep the first pattern of first electrodes and the second pattern of second electrodes separated from each other in other parts than the intersection points, where they appear to overlap. However, due to process variation, some unintentional overlapping may occur also in other parts of the electrode patterns.

In one embodiment, the transparent conductive film comprises an adhesive layer. In one embodiment, the adhesive is selected from a group consisting of acrylic adhesive, silicon adhesive, a crosslinking polymer, and any combination thereof. In one embodiment, the adhesive is an optically clear adhesive (OCA), such as a pressure sensitive optically clear adhesive.

In one embodiment, the structure formed when providing the first transparent layer on the first transparent base film is bonded together with the structure formed when providing the second transparent layer on the second transparent base film with an adhesive.

In one embodiment, reducing the coverage of the transparent conductor material is carried out by using a laser process, an etching process, direct printing, a mechanical process, a burning process, or any combination thereof. In one embodiment, the etching process is a photolithographic process.

In one embodiment, reducing the coverage of the transparent conductor material is carried out by forming at least one spot or at least one line in the transparent conductor material at the intersection area, or by decreasing the thickness of the transparent conductor material at the intersection area. In one embodiment, reducing the coverage of the transparent conductor material is carried out by decreasing the thickness of the at least one of the first electrode and the second electrode at the at least one intersection point.

In one embodiment, the coverage of the transparent conductor material is reduced before and/or after the first transparent layer and the second transparent layer are arranged one on the other.

In one embodiment, reducing the coverage of the transparent conductor material is carried out by removing a predetermined amount of the transparent conductor material.

In one embodiment, reducing the coverage of the transparent conductor material is carried out by making the first electrode and/or the second electrode thinner at the intersection area, e.g. at the intersection point. In one embodiment, reducing the coverage of the transparent conductor material is carried out by making the first electrode and/or the second electrode thinner in thickness at the intersection area, e.g. at the intersection point, and/or by making the first electrode and/or the second electrode to have a thinner width at the intersection area, e.g. at the intersection point.

In one embodiment, the thickness of at least one of the first electrode and the second electrode is thinner at the intersection area(s) such that the total thickness of the first electrode and the second electrode at the intersection area(s) is essentially similar to the thickness of each of the first electrode and the second electrode separately outside the intersection area(s). In one embodiment, the thickness of at least one of the first electrode and the second electrode is thinner at the intersection point(s) such that the total thickness of the first electrode and the second electrode at the intersection point(s) is essentially similar to the thickness of each of the first electrode and the second electrode separately outside the intersection point(s).

In one embodiment, the transparent touch sensitive film is a resistive touch sensitive film. In one embodiment, the transparent touch sensitive film is a capacitive touch sensitive film.

The transparent layers comprise transparent conductor material that is patterned to have a pattern of electrodes and optionally at least one passive gap area separated from the pattern of electrodes. Thus, the transparent conductor material may be used to form both the pattern of electrodes and the passive gap area. The transparent conductor material may comprise any appropriate, sufficiently transparent conductor material or any combination of such materials.

In one embodiment, the transparent conductor material comprises or consists of a conductive high aspect ratio molecular structure (HARMS) network. In one embodiment, the transparent conductor material comprises a conductive high aspect ratio molecular structure (HARMS) network.

A conductive "HARMS" or a "HARM structure" refers to electrically conductive "nanostructures", i.e. structures with one or more characteristic dimensions in nanometer scale, i.e. less or equal than about 100 nanometers. "High aspect ratio" refers to dimensions of the conductive structures in two perpendicular directions being in significantly different magnitudes of order. For example, a nanostructure may have a length which is tens or hundreds times higher than its thickness and/or width. In a HARMS network, a great number of said nanostructures are interconnected with each other to form a network of electrically interconnected molecules. As considered at a macroscopic scale, a HARMS network forms a solid, monolithic material in which the individual molecular structures are disoriented or non-oriented, i.e. are oriented substantially randomly, or oriented.

Various types of HARMS networks can be produced in the form of thin transparent layers with reasonable resistivity.

In one embodiment, the conductive HARM structures comprise metal nanowires, such as silver nanowires.

In one embodiment, the conductive HARM network comprises carbon nanostructures. In one embodiment, the carbon nanostructures comprise carbon nanotubes, carbon nanobuds, carbon nanoribbons, or any combination thereof. In one embodiment, the carbon nanostructures comprise carbon nanobuds, i.e. carbon nanobud molecules. The carbon nanobuds or the carbon nanobud molecules, have fullerene or fullerene-like molecules covalently bonded to the side of a tubular carbon molecule. Carbon nanostructures, especially carbon nanobuds, may provide advantageous both from electrical, optical (transparency), and mechanical (robustness combined with flexibility and/or deformability) points of view.

In one embodiment, the transparent conductor material comprises or consists of a transparent conductive oxide. In one embodiment, the transparent conductor material comprises or consists of indium tin oxide (ITO), zinc oxide, aluminium-doped zinc oxide (AZO), fluorine doped tin oxide (FTO), or any combination thereof. In one embodiment, the transparent conductor material comprises a transparent conductive oxide. In one embodiment, the transparent conductive oxide is indium tin oxide (ITO), zinc oxide, aluminium-doped zinc oxide (AZO), fluorine doped tin oxide (FTO), or any combination thereof. In one embodiment, the transparent conductive oxide is doped with a doping agent, such as fluorine.

In one embodiment, the transparent conductor material comprises or consists of graphene, silver nanowires, poly (3,4-ethylenedioxythiophene) PEDOT, poly(3,4-ethylenedioxythiophene) polystyrene sulfonate PEDOT:PSS, polyaniline, a metal mesh conductor, or any combination thereof. In one embodiment, the transparent conductor material comprises graphene, silver nanowires, poly(3,4-ethylenedioxythiophene) PEDOT, poly(3,4-ethylenedioxythiophene) polystyrene sulfonate PEDOT:PSS, polyaniline, a metal mesh conductor, or any combination thereof.

The thickness of each of the transparent layers may be designed in accordance with the properties of the transparent conductive material, especially the resistivity or conductivity thereof. For example, in the case of the transparent conductor material comprising carbon nanostructures, the transparent layer may have, for example, a thickness of 1-1000 nm. In one embodiment, the thickness of the transparent layer is 0.1-1000 nm, or 10-800 nm, or 50-300 nm. In one embodiment, the thickness of the transparent layer is 10-50 nm, or 50-100 nm, or 150-300 nm, or 500-1000 nm. However, as is understood based on the present specification, the thickness of a separate transparent layer may vary from one part to another taking into consideration the possible reduction of the coverage of the transparent conductor material at the at least one intersection areas.

In one embodiment, providing at least one transparent base film comprises making available, a complete transparent base film formed and manufactured beforehand. Such transparent base film may be first prepared, by any appropriate process, for the use thereof in the method for producing the transparent conductive film. In one embodiment, providing at least one transparent base film comprises manufacturing the transparent base film as a part of the method for producing the transparent conductive film.

In one embodiment, a transparent layer comprising transparent conductor material is provided by depositing transparent conductor material on the transparent base film.

Depending on the material of the transparent layer, various procedures existing in the art may be used for providing the transparent layer. For example, ITO may be deposited by sputtering in vacuum conditions. PEDOT or silver nanowires may be formed, for example, by printing. Metal meshes may be formed, for example, by printing or electroplating or by any other appropriate method.

In the case of the transparent conductor material comprising carbon nanostructures, such as carbon nanobud molecules, deposition may be carried out, for example, by using the commonly known methods of filtration from gas phase or from liquid, deposition in a force field, or deposition from a solution using spray coating or spin drying. The carbon nanobud molecules can be synthesized, for example, using the method disclosed in WO 2007/057501, and deposited on a transparent base film, for example, directly from the aerosol flow, e.g. by assistance of e.g. electrophoresis or thermophoresis, or by a method described in Nasibulin et al: "Multifunctional Free-Standing Single-Walled 20 Carbon Nanotube Films", ACS NANO, vol. 5, no. 4, 3214-3221, 2011.

In one embodiment, transparent conductor material is deposited on the at least one transparent base film. In one embodiment, the transparent conductor material is deposited in a pattern on the at least one transparent film.

In one embodiment, the transparent layer comprising transparent conductor material is patterned to have a pattern of electrodes and optionally at least one passive gap area separated from the pattern of electrodes. The pattern of electrodes, as well as the optional at least one passive gap area, may be provided simultaneously or after the transparent layer has been formed or deposited on the transparent base film. In one embodiment, the transparent layer is formed or deposited on the transparent base film directly in a pattern forming the electrodes and optionally the passive gap area.

In said patterning, various processes may be used. In one embodiment, a laser process, an etching process, direct printing, a mechanical process, a burning process, or any combination thereof, is used for forming a pattern of electrodes and optionally at least one passive gap area. In one embodiment, the laser process is laser ablation. In one embodiment, the etching process is a photolithographic process.

In one embodiment, the transparent conductive film comprises or is provided with at least one additional layer. In one embodiment, a protecting layer is provided on the transparent conductive film. The additional layer may comprise base or cover plates. Any of the base and cover plates may comprise a transparent plastic material, such as acrylate or PC or a multilayer laminate of these, or a glass material, such as a float glass (comprising of $SiO_2$, $Na_2O$, CaO, MgO), sodalime, or aluminosilicate or borosilicate glass, or a laminate consisting of such glass and/or plastic materials. A typical automotive safety glass may comprise two float glass sheets with a plastic e.g. polyvinyl butyral (PVB) embedded in-between.

In one embodiment, the transparent conductive film is formed as a flexible structure so as to allow bending thereof, preferably reversibly and repeatedly, along a three dimensional surface in at least one direction. In one embodiment, the transparent conductive film is bendable in at least two directions simultaneously. Depending on the material used for producing the transparent conductive film, the smallest radius of curvature in which the transparent conductive film may be bent may lie, for example, in the range of 0.5 mm to 3 or 10 mm. The smallest radius of curvature may be achieved for transparent layers comprising carbon nanostructures such as carbon nanobuds, whereas for other materials, the lowest possible radius of curvature may be higher.

In one embodiment, the transparent conductive film is formed as a deformable structure so as to allow deforming of the transparent conductive film along a three dimensional surface. Said deforming may be based on, for example, stretchability of the transparent conductive film, and may be carried out, for example, by using thermoforming. Flexibility and/or deformability may have the added utility of enabling use of the transparent conductive film as a curved, or generally three dimensionally shaped structure, such as a dome shaped structure.

In one embodiment, the transparent conductive film has been subjected to thermoforming and/or injection molding. In one embodiment, the method comprises subjecting the transparent conductive film to injection molding and/or thermoforming. In one embodiment, the transparent conductive film is formed to have a three-dimensional shape.

It will be understood that the benefits and advantages described in this application may relate to one embodiment or may relate to several embodiments. The embodiments are not limited to those that solve any or all of the stated problems or those that have any or all of the stated benefits and advantages.

The embodiments described hereinbefore may be used in any combination with each other. Several of the embodiments may be combined together to form a further embodiment. A transparent conductive film, a method, a touch sensing device or a use, to which the application is related, may comprise at least one of the embodiments described hereinbefore.

The transparent conductive film produced by the method as defined in the current specification has the added utility of having an improved visual appearance as the intersection areas, that the overlap of the transparent conductor material of the first transparent layer and of the second transparent layer form, may be essentially non-visible to the bare eye of a human being.

The method for producing the transparent conductive film has the added utility of enabling the production of a transparent conductive film without the use of additional filler material of the transparent conductor material that is usually needed in order to reduce the effect of visible patterns formed e.g. by the electrodes.

The transparent conductive film has the added utility of having a suitable transparency through the film without sacrificing the visual uniformity compared to a similar transparent conductive film that does not have the coverage of the transparent conductor material adjusted or reduced at the intersection areas.

The method for producing the transparent conductive film has the added utility of enabling the production of a transparent conductive film showing improved conductivity without sacrificing the transparency and vice versa.

EXAMPLES

Reference will now be made in detail to the described embodiments, examples of which are illustrated in the accompanying drawings.

The description below discloses some embodiments in such a detail that a person skilled in the art is able to utilize the method, the transparent conductive film and the touch sensitive device based on the disclosure. Not all steps of the embodiments are discussed in detail, as many of the steps will be obvious for the person skilled in the art based on this specification.

For reasons of simplicity, item numbers will be maintained in the following exemplary embodiments in the case of repeating components.

FIG. 1 illustrates schematically a front view of a transparent conductive film 1 according to one embodiment described in this specification. From FIG. 1 one can see the predetermined pattern that the first pattern of first electrodes 4a and the second pattern of second electrodes 4b form when the first transparent layer and the second transparent layer are arranged one on the other in relation to each other such that the first pattern of first electrodes 4a and the second pattern of second electrodes 4b form a predetermined number of intersection areas or intersection points $5_1, 5_2 \ldots 5_n$, where the electrodes 4a of the first transparent layer and the electrodes 4b of the second transparent layer appear to cross each other when viewed from an essentially perpendicular direction to the first side or the second side of the at least one transparent base film. It is to be emphasized that in FIG. 1 the pattern the electrodes form, is highlighted in black to better illustrate the embodiment. In practice, however, the electrodes may be transparent and essentially non-visible to the bare eye. Not all the intersection points formed when the first electrodes cross the second electrodes are illustrated with an indication to the reference numbers in FIG. 1 but it is apparent that by the indication $5_1, 5_2 \ldots 5_n$ is meant all the intersection points formed in the predetermined pattern.

Figure 2:
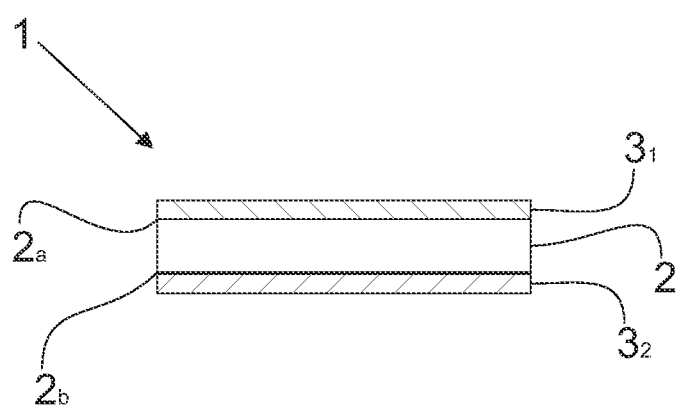
FIG. 2 illustrates schematically a sectional view of a transparent conductive film according to one embodiment.

FIG. 2 illustrates schematically a sectional view of a transparent conductive film 1 according to one embodiment, wherein the first transparent layer $3_1$ having a first pattern of first electrodes is provided, e.g. deposited, on the first side 2a of a transparent base film 2 and the second transparent layer $3_2$ having a second pattern of second electrodes is provided, e.g. deposited, on the second side 2b of the transparent base film 2. FIG. 2 does not illustrate the thickness variations or differences of the first transparent layer and the second transparent layer resulting from the transparent conductor material of the first transparent layer and the transparent conductor material of the second transparent layer forming the a at least one intersection area and the at least one non-overlapping area.

Figure 3A:
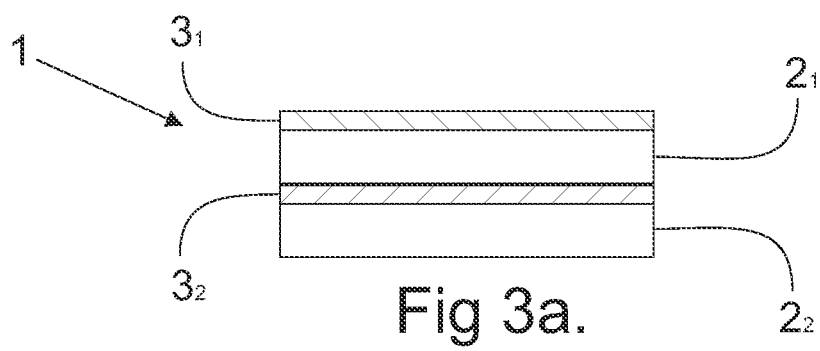
FIG. 3a illustrates schematically a sectional view of a transparent conductive film according to one embodiment.
Figure 3B:
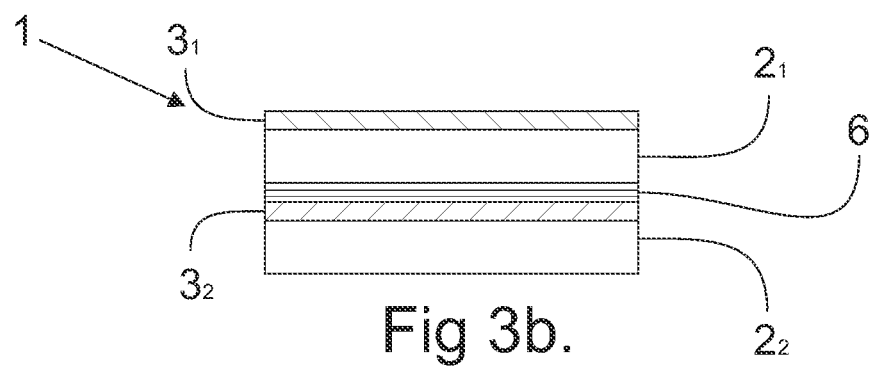
FIG. 3b illustrates schematically a sectional view of a transparent conductive film according to one embodiment.

FIG. 3a illustrates schematically a sectional view of a transparent conductive film 1 according to one embodiment, wherein the first transparent layer $3_1$ having a first pattern of first electrodes is formed on a first transparent base film $2_1$, e.g. on a first side of a first transparent base film $2_1$, and the second transparent layer $3_2$ having a second pattern of second electrodes is formed on a second transparent base film $2_2$, e.g. on a first side of a second transparent base film $2_2$. These two structures formed when providing the transparent layers on the transparent base films are then arranged one on the other. FIG. 3b illustrates schematically a sectional view of the transparent conductive film according to the embodiment of FIG. 3a with the difference that an adhesive 6 is used to bond together the above described structures comprising the transparent layers on the transparent base films. FIG. 3a and FIG. 3b do not illustrate the thickness variations or differences of the first transparent layer and the second transparent layer resulting from the transparent conductor material of the first transparent layer and the transparent conductor material of the second transparent layer forming the a at least one intersection area and the at least one non-overlapping area.

Figure 4A:
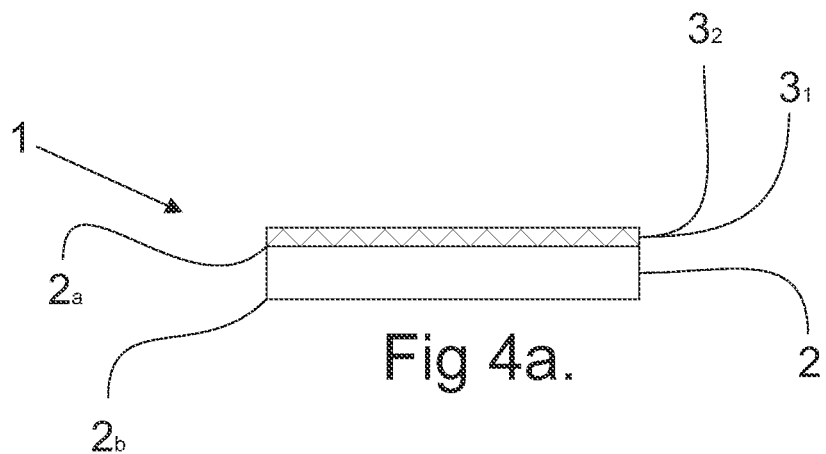
FIG. 4a illustrates schematically a sectional view of a transparent conductive film according to one embodiment.
Figure 4B:
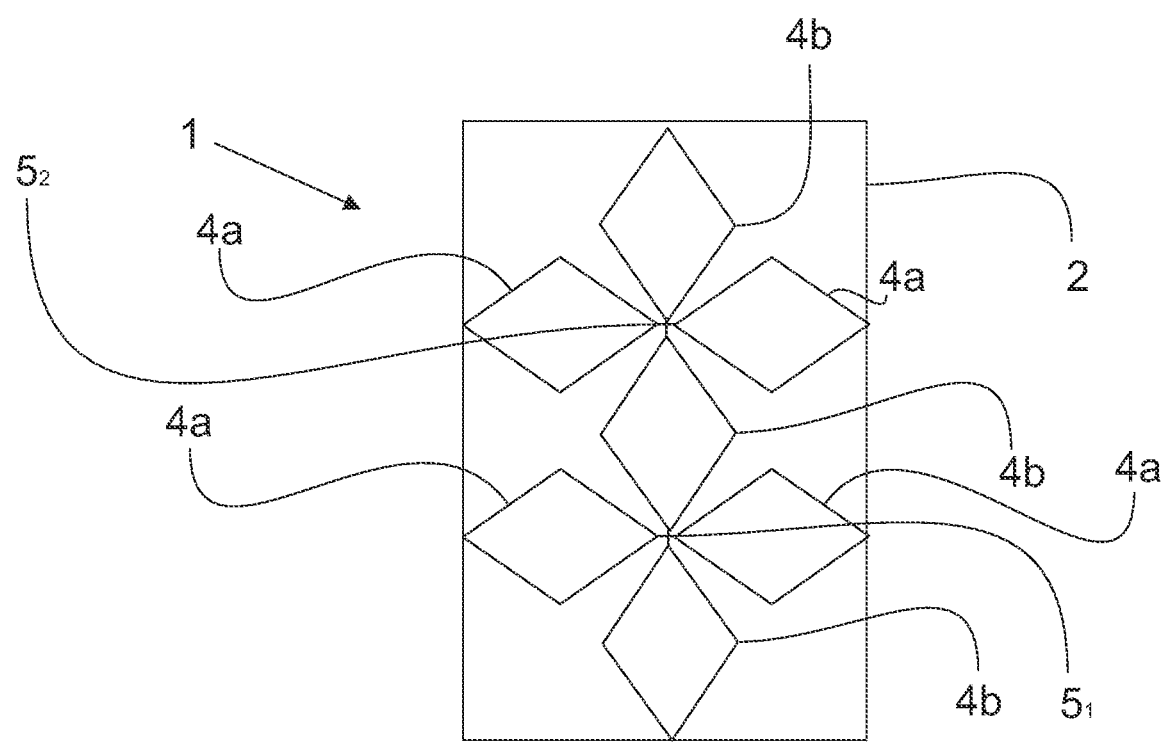

FIG. 4a illustrates schematically a sectional view of the transparent conductive film 1 according to one embodiment, wherein the first transparent layer $3_1$ and the second transparent layer $3_2$ are both provided on a first side $2a$ of a transparent base film 2. FIG. 4a does not illustrate the thickness variations or differences of the first transparent layer and the second transparent layer resulting from the transparent conductor material of the first transparent layer and the transparent conductor material of the second transparent layer forming the a at least one intersection area and the at least one non-overlapping area. FIG. 4b illustrates schematically a front view of the transparent conductive film as illustrated in FIG. 4a, wherein the first transparent layer and the second transparent layer are arranged one upon the other in relation to each other such that the first pattern of first electrodes 4a and the second pattern of second electrodes 4b appear to cross each other at a predetermined number of intersections areas, e.g. intersection points ($5_1$, $5_2$), while the first pattern of first electrodes and the second pattern of second electrodes are not otherwise essentially overlapping.

Figure 5A:
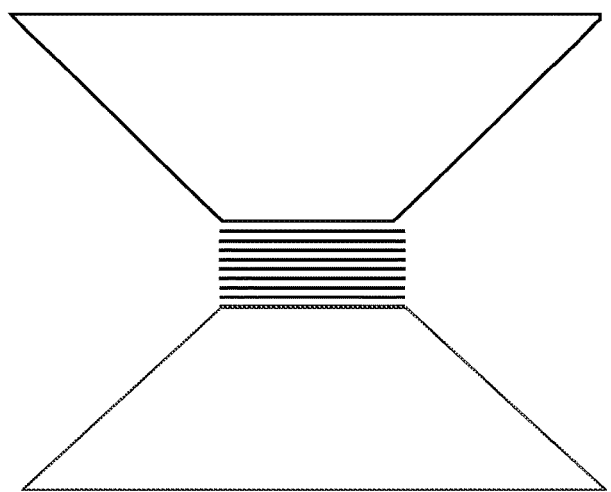
FIG. 5a illustrates a first transparent layer comprising transparent conductor material being patterned to have a first pattern of first electrodes according to one embodiment.
Figure 5B:
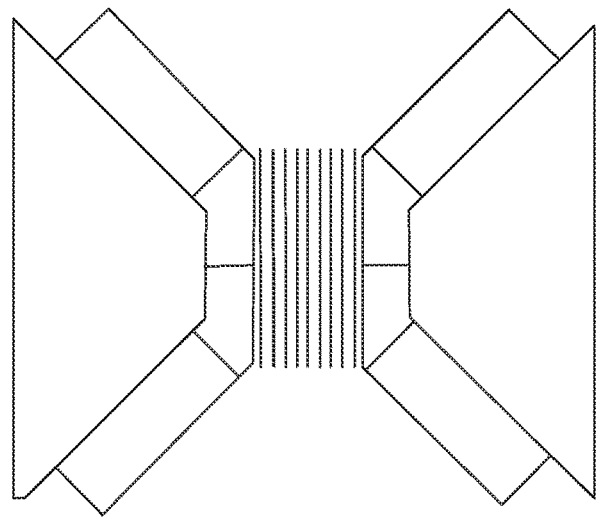
FIG. 5b illustrates a second transparent layer comprising transparent conductor material being patterned to have a second pattern of second electrodes and second passive gap areas according to one embodiment.
Figure 5C:
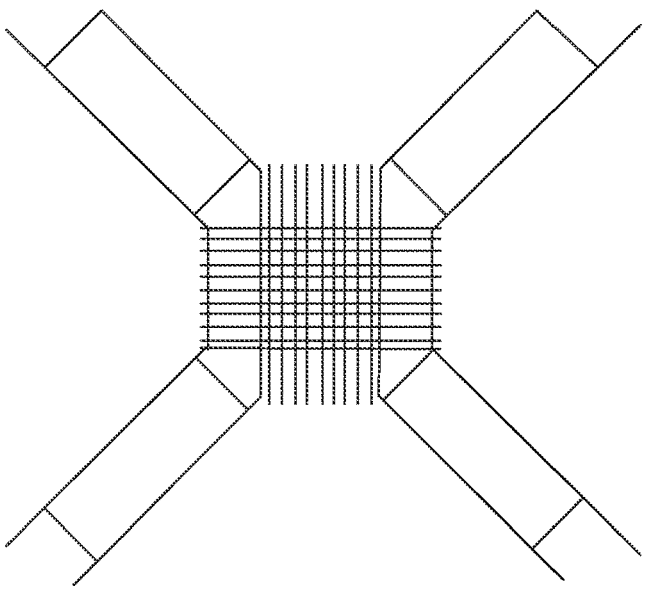
FIG. 5c illustrates the situation when the first transparent layer comprising transparent conductor material of FIG. 5a and the second transparent layer comprising conductor material of FIG. 5b are arranged one on the other according to one embodiment.

FIG. 5a illustrates a first transparent layer comprising transparent conductor material being patterned to have a first pattern of first electrodes according to one embodiment, e.g. X-electrodes. FIG. 5b illustrates a second transparent layer comprising transparent conductor material being patterned to have a second pattern of second electrodes, e.g. Y-electrodes, and second passive gap areas according to one embodiment. FIG. 5c illustrates the situation when the first transparent layer comprising transparent conductor material of FIG. 5a and the second transparent layer comprising transparent conductor material of FIG. 5b are arranged one on the other according to one embodiment.

Figure 6A:
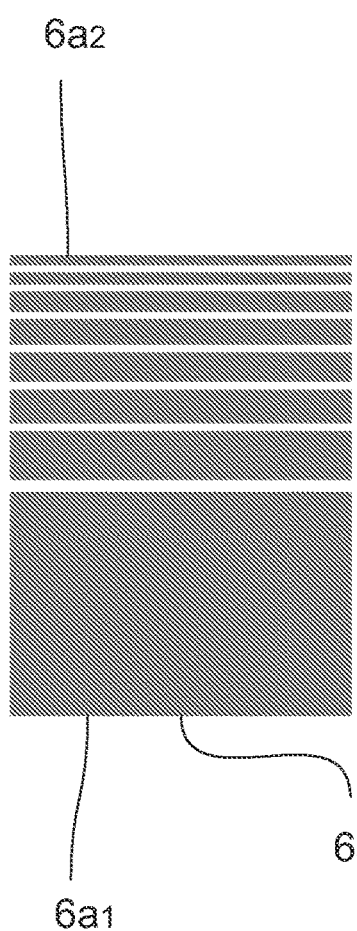
FIG. 6a-6c illustrate schematically the gradual reduction of coverage of the transparent conductor material of the first gap are and the second gap area.
Figure 6B:
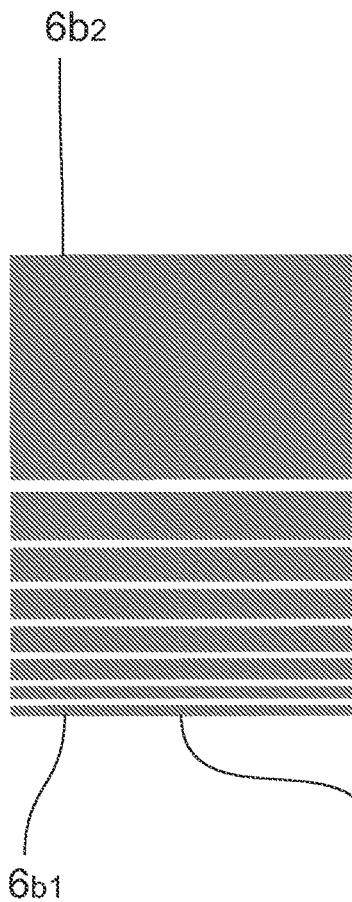
Figure 6C:
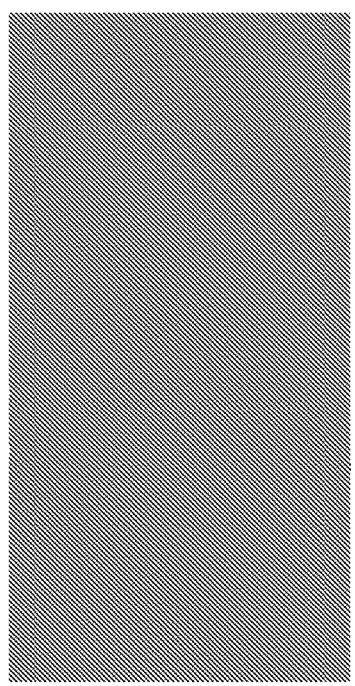

FIG. 6a illustrates schematically how the coverage of the transparent conductor material may be adjusted. In FIGS. 6a-6c, an embodiment is illustrated how the coverage of the transparent conductor material of a first passive gap area 6a and a second passive gap area 6b that may at least partly overlap in a situation where a first transparent layer and a second transparent layer are arranged one on the other in a vertical direction. FIG. 6a schematically illustrates how the coverage of transparent conductor material of the first passive gap area 6a may be gradually reduced from the first edge $6a_1$ of the first passive gap area to the second edge $6a_2$ of the first passive gap area. FIG. 6b schematically illustrates how the coverage of the transparent conductor material of the second passive gap area 6b may be gradually reduced from the first edge $6b_1$ to the second edge $6b_2$ of the second passive gap area in an inverse manner compared to the first passive gap area 6a. FIG. 6c schematically illustrates the situation when the first transparent layer and the second transparent layer are arranged one on the other such that, in this embodiment, the first passive gap area and the second passive gap area appear to at least partly overlap.

Figure 7A:
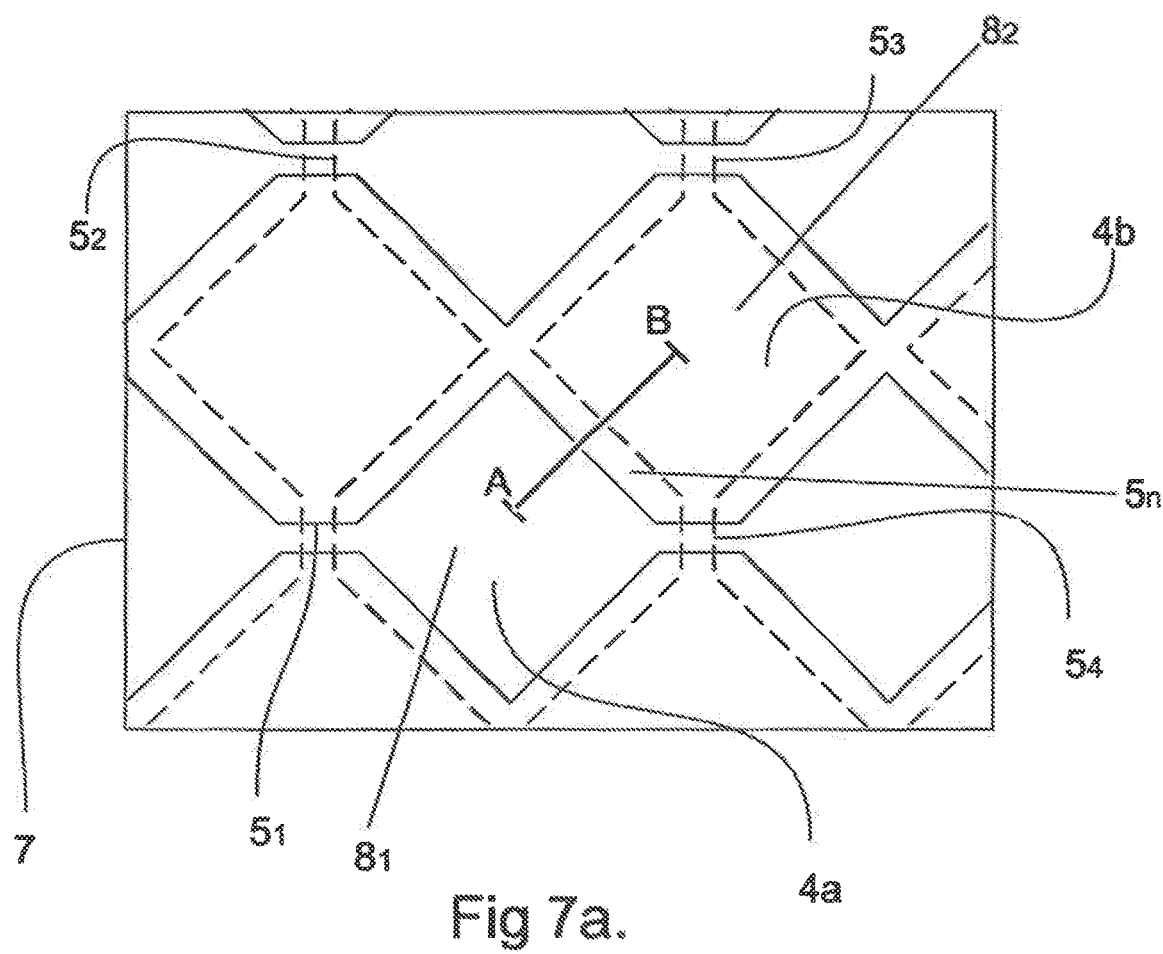
FIG. 7a illustrates schematically a front view of a transparent conductive film according to one embodiment.
Figure 7B:
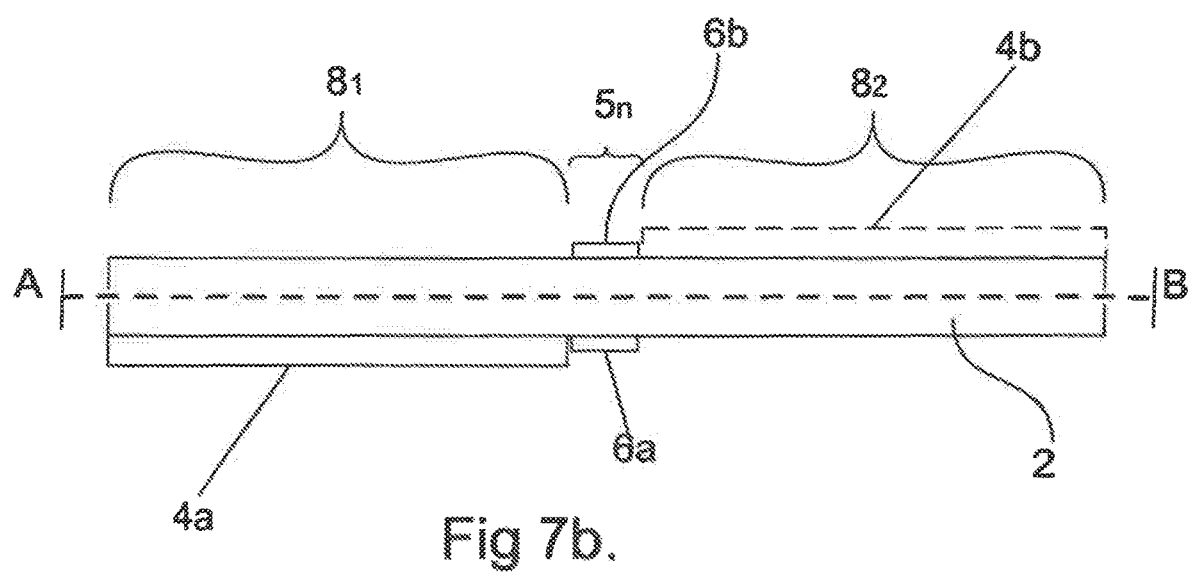

FIG. 7a illustrates schematically a front view of a transparent conductive film according to one embodiment and FIG. 7b illustrates schematically a sectional view of a part of the transparent conductive film of FIG. 7a, i.e. the sectional view of the transparent conductive film from point A to point B as indicated in FIG. 7a and FIG. 7b. In FIG. 7a an observation region 7 of the transparent conductive film is presented. The transparent conductive film may extend beyond the presented observation region 7. The embodiment illustrated in FIG. 7a comprises a first transparent layer of transparent conductor material being patterned to have a first pattern of first electrodes 4a and a second transparent layer of transparent conductor material being patterned to have a second pattern of second electrodes 4b. In the embodiment of FIG. 7a, the first pattern of first electrodes 4a and the second pattern of second electrodes 4b form four intersection areas $5_1,5_2,5_3,5_4$ where the electrodes appear to cross each other. Further, in the embodiment of FIG. 7a, the first pattern of first electrodes 4a and the second pattern of second electrodes 4b form also non-overlapping areas, two of which are indicated with reference numbers in FIG. 7a, i.e. as $8_1,8_2$. In these non-overlapping areas the first pattern of first electrodes and the second pattern of second electrodes may not essentially overlap.

As is illustrated in FIG. 7b, the first transparent layer further comprises first passive gap areas of transparent conductor material separated from the first pattern of first electrodes and the second transparent layer further comprises second passive gap areas of transparent conductor material separated from the second pattern of second electrodes. These passive gap areas appear to at least partly overlap thus forming further intersection areas; one of which is indicated by the reference number $5_n$ in FIG. 7a.

In FIG. 7b there is illustrated the sectional view from point A to point B of the embodiment of FIG. 7a. In FIG. 7b one can see the embodiment wherein one transparent base film 2 is provided and having within the observation region a first transparent layer comprising transparent conductor material being patterned to have a first pattern of first electrodes 4a and a first passive gap area 6a separated from the first pattern of first electrodes, and a second transparent layer comprising transparent conductor material being patterned to have a second pattern of second electrodes 4b and a second passive gap area 6b separated from the second pattern of second electrodes. The first transparent layer and the second transparent layer are arranged one on the other in a vertical direction such that the transparent conductor material 4a,6a of the first transparent layer and the transparent conductor material 4b,6b of the second transparent layer form an intersection area $5_n$ where transparent conductor material 6a of the first transparent layer and transparent conductor material 6b of the second transparent layer appear to overlap when viewed from an essentially perpendicular direction to the first side or the second side of the transparent base film 2, and two non-overlapping areas $8_1,8_2$ where transparent conductor material 4a of the first transparent layer and transparent conductor material 4b of the second transparent layer do not appear to overlap. FIG. 7b schematically illustrates one manner of reducing the coverage of the transparent conductor material of the first transparent layer and of the second transparent layer at the intersection area compared to the coverage of the transparent conductor material of the first transparent layer and the second transparent layer at the non-overlapping areas.

Example 1—Producing a Transparent Conductive Film

In this example a transparent conductive film was produced by the following procedure:

Firstly, in this example, two distinct transparent base films were provided, i.e. a first transparent base film and a second transparent based film. Both of the transparent base films were polycarbonate (PC) films.

Then a first transparent layer comprising transparent conductor material was formed on the first transparent base film and a second transparent layer comprising transparent conductor material was formed on the second transparent base film.

In this example the transparent conductor material comprised carbon nanobud molecules. Carbon nanobud molecules can be synthesized e.g. following the details of the synthesis process disclosed in WO 2007/057501 A1. The carbon nanobud molecules were deposited on each of the two polycarbonate films to form a transparent layer comprising transparent conductor material thereon.

Having deposited the carbon nanobud molecules on each of the two polycarbonate film, patterning was carried out to form a first pattern of first electrodes in the first transparent layer and a second pattern of second electrodes in the second transparent layer. Laser ablation (Delphi LES-G5, IR wave length nanosecond pulse laser) was used for making the first pattern of first electrodes and the second pattern of second electrodes, respectively. The following laser parameters were used for making the first pattern of first electrodes and the second pattern of second electrodes: Power: 24, Frequency 250, mark speed (mm/s): 2000, count: 1.

Simultaneously with providing the transparent layers the predetermined patterns of electrodes also the coverage of the transparent conductor material, at predetermined intersections points that were formed at a later stage when arranging the first transparent layer and the second transparent layer one on the other such that the formed first electrodes and second electrodes will appear to cross each other at the intersection points, was reduced from the first electrode and the second electrode at these intersection points by using the same laser ablation process as that was used for making the first pattern of first electrodes and the second pattern of second electrodes. The coverage of the transparent conductor material was reduced to be lower than outside the intersection points. The following laser parameters were used for reducing the coverage of the transparent conductor material of both the first electrode and the second electrode at the intersection points: Delphi LES-G5, IR wave length nanosecond pulse laser, Power: 20, Frequency 250, mark speed (mm/s): 2000, count: 1.

Consequently, a first transparent layer comprising transparent conductor material being patterned to have a first pattern of first electrodes was provided on a first transparent base film and a second transparent layer comprising transparent conductor material being patterned to have a second pattern of second electrodes was provided on second transparent base film. Then these two structures were arranged one on the other.

In this example, the coverage of transparent conductor material was reduced by 45 area-% from both the first electrodes and the second electrodes at the intersection points. As a result, the total percentage of visible light absorbed by the transparent conductor material of the first transparent layer and of the second transparent layer at the intersection point being decreased from 10% to 7%. Even though being formed of different layers transparent conductor material, the formed transparent conductive film had the visual appearance of being formed of only one layer of transparent conductor material. Especially, the intersection points formed by the first pattern of first electrodes and the second pattern of second electrodes could not be distinguished by the bare eye.

Example 2—Producing a Transparent Conductive Film

In this example a transparent conductive film was produced by the following procedure:

Firstly, the procedure for providing a first transparent layer comprising transparent conductor material on the first transparent base film and a second transparent layer comprising transparent conductor material on the second transparent base film was repeated as described in Example 1.

Having deposited the carbon nanobud molecules on each of the two polycarbonate films, patterning was carried out to form a first pattern of first electrodes in the first transparent layer and a second pattern of second electrodes in the second transparent layer. In this example the first pattern of first electrodes and the second pattern of second electrodes were formed by the following photolithographic process: Firstly a layer of photoresist material was spin coated on the deposited layer of carbon nanobud molecules to a thickness of about 1 µm. Then a photomask having a predetermined pattern was brought in alignment with the transparent base film. The photoresist was then exposed to UV light through openings in the photomask. The polymer molecules in the exposed regions of photoresist were altered by the absorption of the UV photons making the altered photoresist more soluble in a developing solution. Then the exposed resist was removed by immersing the whole into a developer. The remaining photoresist served as a masking layer for etching into the transparent layer. An acid etch was then used to remove the part of the transparent layer comprising transparent conductor material, i.e. carbon nanobud molecules, and thus the pattern was transferred to the transparent layer forming thus the first pattern of first electrodes and the second pattern of second electrodes. Finally the photoresist was washed away by using an acetone solvent. As above described for Example 1, also in this example the material coverage of the transparent conductor material at the intersection points was reduced by following the above described photolithographic procedure.

Consequently, a first transparent layer comprising transparent conductor material being patterned to have a first pattern of first electrodes was provided on a first transparent base film and a second transparent layer comprising transparent conductor material being patterned to have a second pattern of second electrodes was provided on second transparent base film. Then these two structures were arranged one on the other.

Even though being formed of different layers of transparent conductor material, the formed transparent conductive film had the visual appearance of being formed of only one layer of transparent conductor material. Especially, the intersection points formed by the first pattern of first electrodes and the second pattern of second electrodes could not be distinguished by the bare eye.

It is to be noted that the embodiments of the claims are not limited to those discussed above, but further embodiments may exist within the scope of the claims.

The invention claimed is:

1. A transparent conductive film having an observation region, wherein the transparent conductive film comprises:
at least one transparent base film having a first side and a second side, which is opposite to the first side;
provided on the at least one transparent base film, in the observation region
a first transparent layer comprising transparent conductor material being patterned to have a first pattern of first electrodes and optionally at least one first passive gap area separated from the first pattern of first electrodes, and
a second transparent layer comprising transparent conductor material being patterned to have a second pattern of second electrodes and optionally at least one second passive gap area separated from the second pattern of second electrodes;
wherein the first transparent layer and the second transparent layer are arranged one on the other in a vertical direction such that the transparent conductor material of the first transparent layer and the transparent conductor material of the second transparent layer form
at least one intersection area where the transparent conductor material of the first transparent layer and the transparent conductor material of the second transparent layer appear to at least partly overlap when viewed from an essentially perpendicular direction to the first side or the second side of the at least one transparent base film, and
at least one non-overlapping area where the transparent conductor material of the first transparent layer and the transparent conductor material of the second transparent layer do not appear to overlap; and
wherein the coverage of the transparent conductor material of at least one of the first transparent layer or the second transparent layer, at the at least one intersection area, is reduced to be lower than the coverage of the transparent conductor material of the first transparent layer or the second transparent layer at the at least one non-overlapping area where the transparent conductor material of the first transparent layer and the transparent conductor material of the second transparent layer do not appear to overlap, such that the total percentage of visible light transmitted through the transparent conductor material of the first transparent layer and the second transparent layer is substantially the same over the observation region.

2. The transparent conductive film of claim 1, wherein the first transparent layer and the second transparent layer are arranged one on the other in a vertical direction such that the first electrodes and the second electrodes form at least one intersection area where the first electrodes and the second electrodes appear to overlap when viewed from the essentially perpendicular direction to the first side or the second side of the at least one transparent base film.

3. The transparent conductive film of claim 1, wherein the first transparent layer is patterned to have at least one first passive gap area, and the second transparent layer is patterned to have at least one second passive gap area, and wherein the at least one first passive gap area and the at least one second passive gap area appear to at least partly overlap, when viewed from an essentially perpendicular direction to the first side or the second side of the at least one transparent base film.

4. The transparent conductive film of claim 3, wherein the first passive gap area has a first edge and a second edge, which is opposite to the first edge, and wherein the second passive gap area has a first edge and a second edge, which is opposite to the first edge, and wherein the coverage of the transparent conductor material is gradually or continuously reduced from the first edge to the second edge of the first passive gap area while the coverage of the transparent conductor material is gradually or continuously reduced in an inverse manner from the second edge to the first edge of the second passive gap area, or vice versa.

5. The transparent conductive film of claim 1, wherein the first transparent layer is provided on the first side of a transparent base film and the second transparent layer is provided on the second side of the transparent base film.

6. The transparent conductive film of claim 1, wherein the first transparent layer is provided on a first transparent base film and the second transparent layer is provided on a second transparent base film, wherein the first transparent layer and the second transparent layer are arranged one on the other in a vertical direction such that the first transparent base film or the second transparent base film is situated between the first transparent layer and the second transparent layer.

7. The transparent conductive film of claim 1, wherein the first transparent layer is provided on the first side of a transparent base film and the second transparent layer is provided on the same first side of the transparent base film such that the first transparent layer and the second transparent layer are arranged one on the other in a vertical direction such that the first electrodes and the second electrodes appear to overlap at least one intersection area while the first pattern of first electrodes and the second pattern of second electrodes are not otherwise overlapping.

8. The transparent conductive film of claim 1, wherein at least one of the at least one transparent base film of the transparent conductive film is made of dielectric material, or wherein all of the transparent base films of the transparent conductive film are made of dielectric material.

9. The transparent conductive film of claim 1, wherein the transparent conductor material comprises a conductive high aspect ratio molecular structure (HARMS) network.

10. The transparent conductive film of claim 1, wherein the transparent conductor material comprises a transparent conductive oxide.

11. The transparent conductive film of claim 1, wherein the transparent conductor material comprises graphene, silver nanowires, poly(3,4-ethylenedioxythiophene) PEDOT, poly(3,4-ethylenedioxythiophene) polystyrene sulfonate PEDOT:PSS, polyaniline, or a metal mesh conductor.

12. The transparent conductive film of claim 1, wherein the transparent conductive film has been subjected to thermoforming and/or injection molding.

13. The transparent conductive film of claim 1, wherein the transparent conductive film is a transparent touch sensitive film.

14. A method for producing a transparent conductive film having an observation region, wherein the method comprises:
providing at least one transparent base film having a first side and a second side, which is opposite to the first side;
providing on the at least one transparent base film, in the observation region
a first transparent layer comprising transparent conductor material being patterned to have a first pattern of first electrodes and optionally at least one first passive gap area separated from the first pattern of first electrodes, and
a second transparent layer comprising transparent conductor material being patterned to have a second pattern of second electrodes and optionally at least one second passive gap area separated from the second pattern of second electrodes;
wherein the first transparent layer and the second transparent layer are arranged one on the other in a vertical direction such that the transparent conductor material of the first transparent layer and the transparent conductor material of the second transparent layer form
at least one intersection area where the transparent conductor material of the first transparent layer and the transparent conductor material of the second transparent layer appear to at least partly overlap when viewed from an essentially perpendicular direction to the first side or the second side of the at least one transparent base film, and
at least one non-overlapping area where the transparent conductor material of the first transparent layer and the transparent conductor material of the second transparent layer do not appear to overlap;

wherein the coverage of the transparent conductor material of at least one of the first transparent layer or the second transparent conductor material of the second transparent layer, at the at least one intersection area, is reduced such that the total percentage of visible light transmitted through the transparent conductor material of the first transparent layer and the second transparent layer is substantially the same over the observation region.

15. The method of claim 14, wherein reducing the coverage of the transparent conductor material is carried out by using a laser process, an etching process, direct printing, a mechanical process, a burning process, or any combination thereof.

16. The method of claim 14, wherein reducing the coverage of the transparent conductor material is carried out by forming at least one spot or at least one line in the transparent conductor material at the intersection area, or by decreasing the thickness of the transparent conductor material at the intersection area.

17. A touch sensing device comprising a transparent conductive film of claim 1.

18. Use of the transparent conductive film of claim 1 in a photovoltaic system, in a heating application, in a current conductor, in a display system, in a display electrode, in a lighting system, in a light switch, or in a light control film.

19. Use of the touch sensing device of claim 17 in a photovoltaic system, in a heating application, in a current conductor, in a display system, in a display electrode, in a lighting system, in a light switch, or in a light control film.

20. A touch sensing device comprising a touch sensitive film of claim 13.

21. A transparent conductive film having an observation region, wherein the transparent conductive film comprises:
   a first transparent layer comprising conductor material having a first pattern of first electrodes, and
   a second transparent layer comprising transparent conductor material having a second pattern of second electrodes;
   wherein the transparent conductor material of the first transparent layer and the second transparent layer form at least one intersection area where the transparent conductor material of the first transparent layer and the second transparent conductor material of the second transparent layer appear to at least partly overlap, and
   at least one non-overlapping area where the transparent conductor material of the first transparent layer and the second transparent layer do not appear to overlap; and
   wherein the coverage of the transparent conductor material of at least one of the first transparent layer or the second transparent layer, at the at least one intersection area, is reduced to be lower than the coverage of the transparent conductor material of the first transparent layer or the second transparent layer at the at least one non-overlapping area where the transparent conductor material of the first transparent layer and the second transparent layer do not appear to overlap.

* * * * *